US007463015B2

United States Patent
Mende et al.

(10) Patent No.: US 7,463,015 B2
(45) Date of Patent: Dec. 9, 2008

(54) TIME SHIFTING SIGNAL ACQUISITION PROBE SYSTEM

(75) Inventors: Michael J. Mende, Portland, OR (US); John B. Rettig, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 220 days.

(21) Appl. No.: 11/648,385

(22) Filed: Dec. 29, 2006

(65) Prior Publication Data

US 2008/0159368 A1    Jul. 3, 2008

(51) Int. Cl.
*G01R 19/00* (2006.01)
*G01R 31/02* (2006.01)
(52) U.S. Cl. .................................... 324/76.11; 324/758
(58) Field of Classification Search ............. 324/76.11, 324/437, 445, 446, 751, 752, 754, 757, 758, 324/690, 696, 715, 724, 72.5; 702/85, 108, 702/121, 122, 127, 189, 190
See application file for complete search history.

(56) References Cited

U.S. PATENT DOCUMENTS

| | | | | |
|---|---|---|---|---|
| 5,025,248 | A * | 6/1991 | Bergeron | 340/596 |
| 5,621,669 | A * | 4/1997 | Bjornsson | 702/85 |
| 5,801,375 | A * | 9/1998 | Sasaki et al. | 250/216 |
| 6,392,219 | B1 | 5/2002 | McCormick et al. | |
| 6,539,316 | B1 * | 3/2003 | Doten et al. | 702/48 |
| 6,925,881 | B1 * | 8/2005 | Kwun et al. | 73/600 |
| 7,196,529 | B2 * | 3/2007 | Burnett et al. | 324/700 |
| 2001/0051766 | A1 * | 12/2001 | Gazdzinski | 600/309 |

OTHER PUBLICATIONS

Tektronix, Inc., 067-1478-00 Power Measurements Deskew Fixture Instructions, Data Sheet, 2 pgs.
Tektronix, Inc., 067-0405-01 and above TDS7000 Series Probe Calibration and Deskew Fixture Instructions, Data Sheet, 2 pgs.
Tektronix, Inc., Utilities—Deskewing Probes and Channels, TDSPWR3 Software Analysis Printed Help Document, pp. 15-17.
Tektronix, Inc., Power Measurement and Analysis software, TDSPWR3 www.tektronix.com/accessories, 2 pgs.
Tektronix, Inc., Instructions—012-1568-00 and 012-1569-00 80E00 Series Sampling Module Extenders, 6 pgs.

* cited by examiner

*Primary Examiner*—Diego Gutierrez
*Assistant Examiner*—Hoai-An D Nguyen
(74) *Attorney, Agent, or Firm*—William K. Bucher

(57) ABSTRACT

A time shifting signal acquisition probe system has a signal acquisition probe having a memory containing a time delay constant representative of the propagation time delay of an electrical signal passing through the signal acquisition probe. A measurement test instrument receives the electrical signal from the signal acquisition probe and generating digital samples of the electrical signal in an acquisition system in response to a trigger signal and producing a waveform record. A communications bus coupled between the signal acquisition probe and the measurement test instrument couples the signal acquisition probe time delay constant from the signal acquisition probe to the measurement test instrument wherein processing circuitry in the measurement test instrument time shifts the waveform record of the electrical signal relative to the trigger signal by the amount of the signal acquisition probe time delay constant.

22 Claims, 12 Drawing Sheets

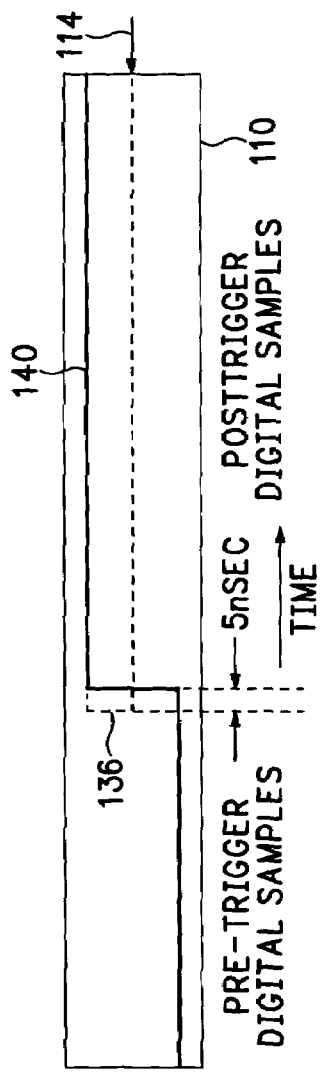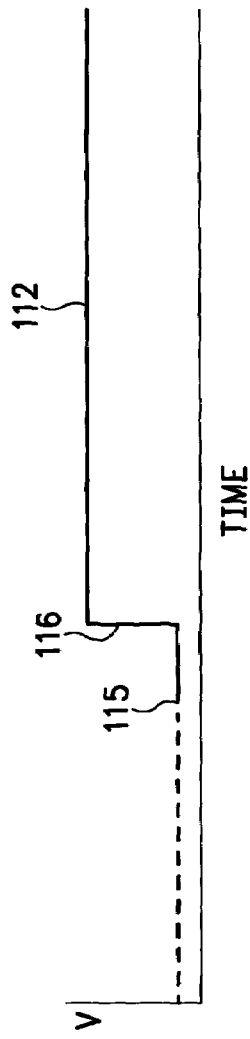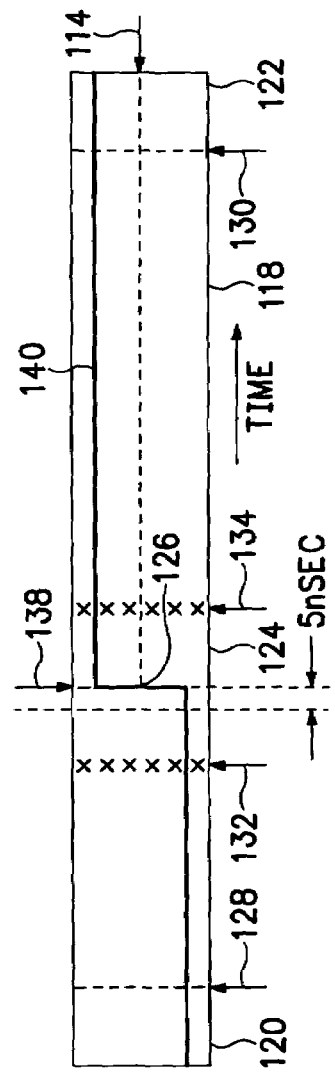

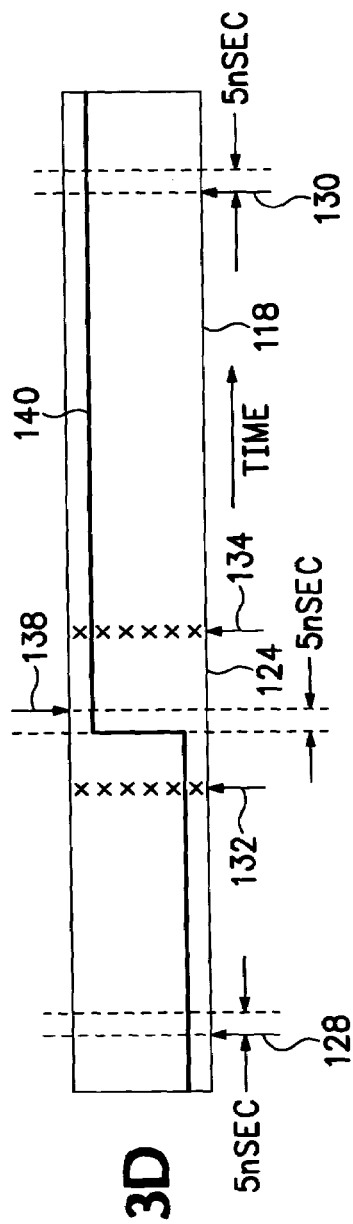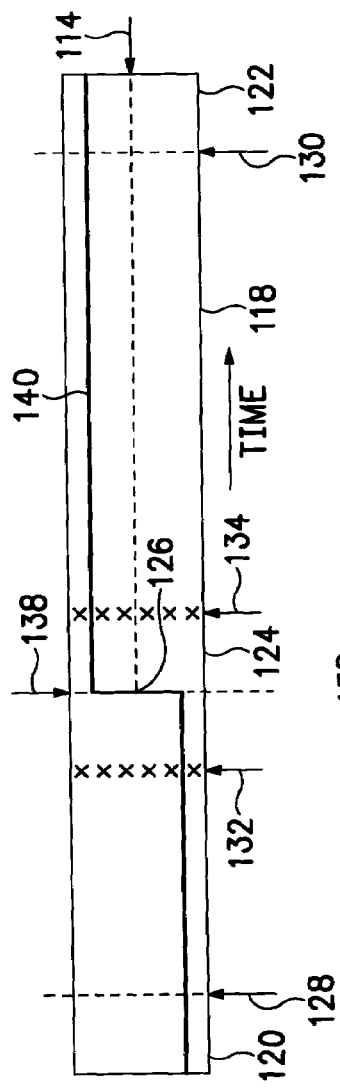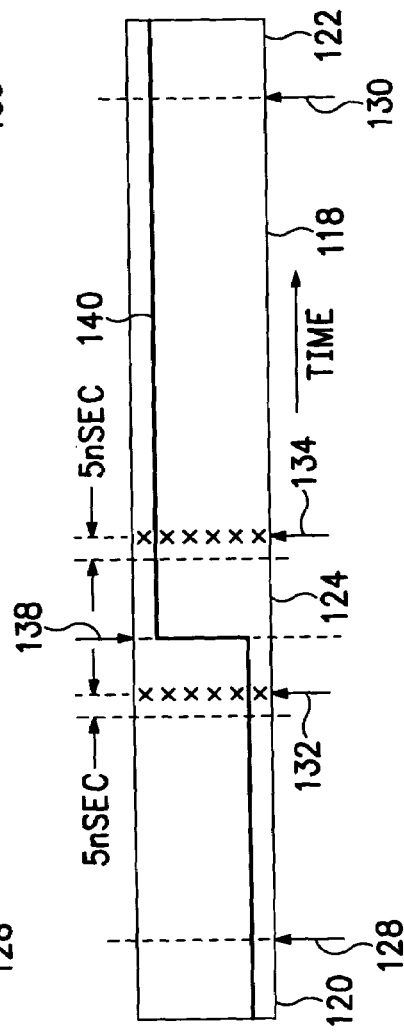
Figure 3D
Figure 4A
Figure 4B

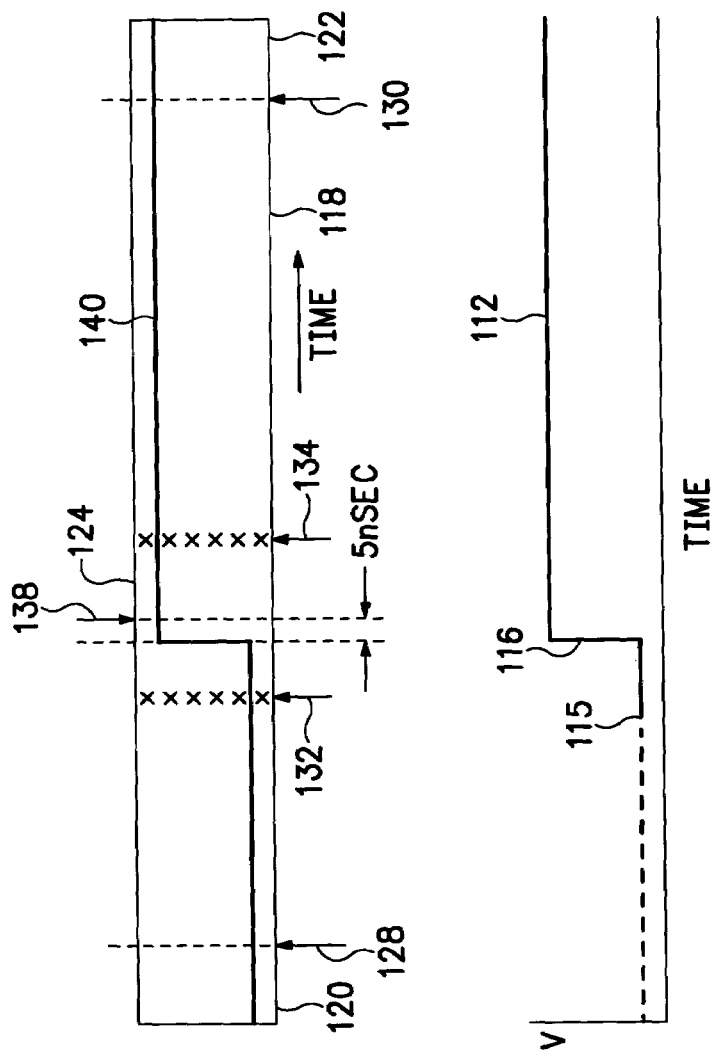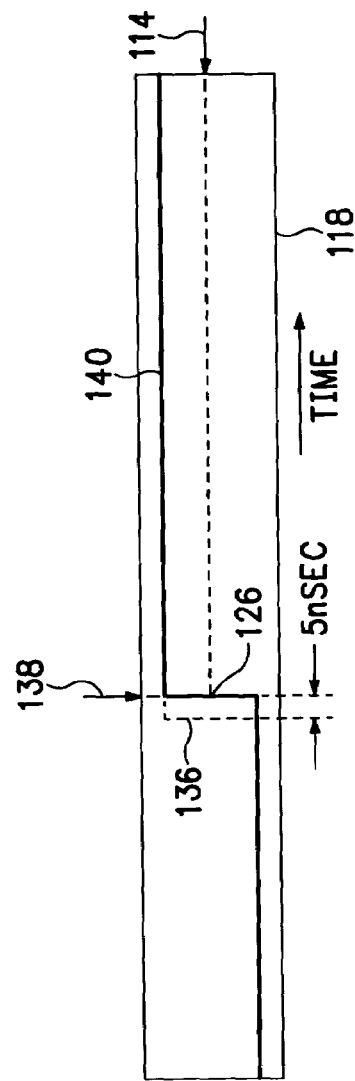
Figure 4C
Figure 5A
Figure 5B

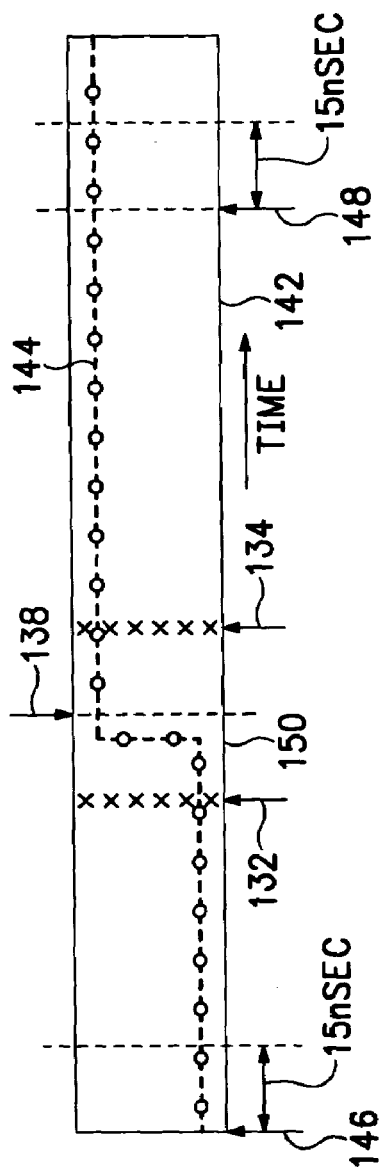
Figure 5F
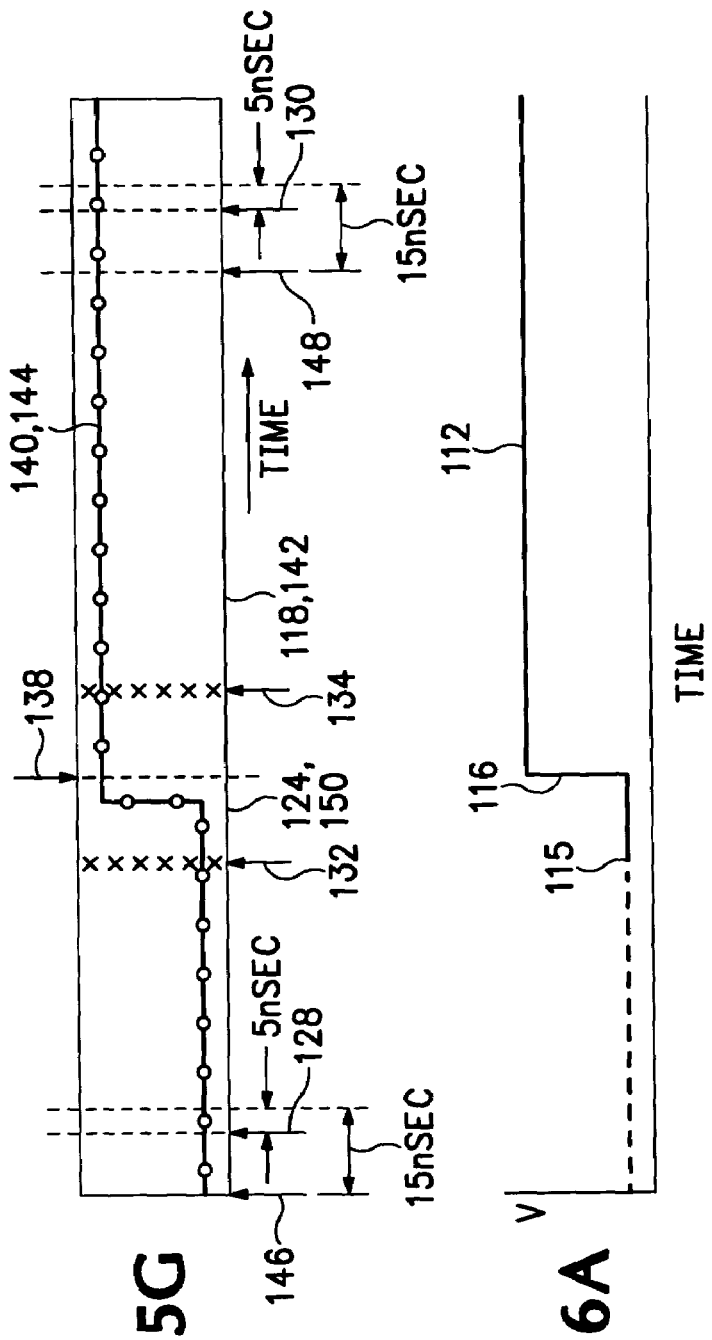
Figure 5G
Figure 6A

TIME SHIFTING SIGNAL ACQUISITION PROBE SYSTEM

BACKGROUND OF THE INVENTION

The present invention relates generally to signal acquisition probes and more particularly to a time shifting signal acquisition probe system.

Digital oscilloscopes generally acquire electrical signals from a device under test via signal acquisition probes coupled to input signal channels of the oscilloscope. Each input signal channel has acquisition circuitry which digitizes the received electrical signal and stores the resulting digital data in a circular buffer. The electrical signals are also coupled to trigger circuitry for generating a trigger signal. In its simplest form, the trigger circuitry is set-up by a user using front panel controls on the digital oscilloscope to trigger at a certain threshold level on a rising or falling portion of the electrical signal on one of the input signal channels. The electrical signals on the other input signal channels trigger off of the electrical signal on the assigned triggered channel. The digital oscilloscope also has controls for setting a hold-off or pre-trigger time. The hold-off or pre-trigger time allows the for the accumulation of digital data prior to a trigger signal. The trigger circuit is armed after the hold-off time and the next occurrence of the electrical signal that matches the trigger parameters results in the generation of the trigger signal. Each of the respective circular buffers continues to receive digital data from their respective acquisition circuits until a post trigger time has expired at which time the digital data in each of the circular buffers is transferred to a reference storage memory as a waveform record. Display circuitry retrieves the waveform records from the reference storage memory and formats the digital data for each of the waveform records and displays a portion of the waveform records on a display device, such as a cathode ray tube or a flat panel display.

Digital oscilloscope, such as the TDS5000B Series Real Time Digital Oscilloscopes, manufactured and sold by Tektronix, Inc., Beaverton, Oreg., are factory calibrated so that propagation delays in the various input signal channels and the trigger circuitry are accounted for. A common signal is applied to each of the input signal channels. One of the input signal channels is designated as a trigger reference signal channel. Waveform records are acquired for each of the input signal channels using the trigger signal from the trigger reference signal channel. The time location of the threshold crossing of the trigger event in the reference waveform record is compared to the time location of corresponding threshold crossings in the other waveform records from the other input signal channels. The differences between the threshold crossing times of the other input signal channels to the threshold crossing of the reference channel is calculated. The leading or lagging time differences of the threshold crossings are stored as calibration values for each of the input signal channels. The resulting calibrated oscilloscope has a calibration plane at the front panel connections of each of the input signal channels. That is, a common signal applied to each of the input signal channels will result in a substantially time aligned digital data in the waveform records. Further, display of the digital data from the waveform records on the digital oscilloscope will be substantially time aligned.

When signal acquisition probes are connected to the input signal channels of the measurement test instrument, the acquired signals may not line-up due to propagation delays existing in signal acquisition probes. This results in what is called signal skewing. Various systems and methods have been developed to deskew the measurement probes to realign the signal from the various input signal channels.

The TDS5000B Series Real Time Digital Oscilloscopes include channel-to-channel deskew capabilities for aligning signals from measurement probes. Voltage and/or current probes are connected to a deskew fixture, such as the 067-1478-00 Power Measurement Deskew Fixture, manufactured and sold by Tektronix, Inc., that provides time aligned output signals. The deskew fixture is coupled to a signal source, such as the AUX OUT output of the TDS5000B oscilloscopes. A probe deskew algorithm is activated in the oscilloscope which allows a user to manually adjust the time positions of displayed waveforms of the acquired signal from the measurement probes. Generally, the displayed waveform of the input signal from the triggered input signal channel is used as a reference and the displayed waveform of the other input signals from the other signal channels are time aligned with the displayed reference waveform. The deskew algorithm allows a user to select an input signal channel to deskew and provides controls for positioning the displayed waveform from the selected input signal channel. As the displayed waveform from the selected input signal channel is time aligned with the displayed reference waveform, the deskew algorithm determines the time difference between the current time position of the displayed waveform and the starting time position of the waveform. Once the selected displayed waveform is time aligned with the displayed reference waveform, the deskew algorithm allows the user to save the time difference value of the selected displayed waveform as the deskew value for the signal acquisition probe and input signal channels combination. Each of the other signal acquisition probe and input signal channel combinations are deskewed in the same manner with the time difference values saved as the deskew values. The signal acquisition probes are removed from the deskew fixture. Because of the deskew operation, any time offset of the signals from the device under test will be as a result the time offsets of the signals in the device under test and not from the propagation time delay differences in the signal acquisition probes.

The TDSPWR3 Power Measurement and Analysis Software, manufactured and sold by Tektronix, Inc., Beaverton, Oreg., includes static deskew algorithms that automatically sets the probe deskew based on the probe type supported. The deskew algorithms contain tables of probe types and nominal skew time values for each of the probe types. The static deskew algorithms include a user interface where a user selects the probe type of the probe connected to a selected "FROM" input signal channel and the probe type of the probe connected to a selected "TO" input signal channel. The user presses a run button and the static deskew algorithms repositions the "TO" input signal channel to the "FROM" input signal channels by the amount of the deskew time value of the probe connected to the "TO" input signal channel.

The TDS8200 Digital Sampling Oscilloscope, manufactured and sold by Tektronix, Inc., Beaverton, Oreg., has multiple slots or bays for receiving various electrical modules for measuring electrical or optical signals. Each slot has an electrical interface that provides electrical power, communications and signal transport to and from the electrical modules. The 80E00 Series of electrical Sampling Modules is one set of modules usable with the TDS8200 Digital Sampling Oscilloscope. The sampling modules samples and digitizes a signal under test in response to a repetitive strobe signal and couples the digitized samples to the oscilloscope. Optional 80E00 Series Sampling Module Extenders may be used to place the electrical module outside the oscilloscope bay to avoid input signal degradation that can occur when using interconnect cables between the sampling module and the device under test. There is a one meter extender cable having a nominal +5 ns propagation delay and a two meter extender cable having a nominal +10 ns propagation delay. Each electrical interface has two lines dedicated to monitoring the status of the electrical module in the oscilloscope. The status lines are either open or shorted and indicate if an extender cable is present and, if so, the length of the extender cable connected to the electrical module. The oscilloscope communicates with the electrical module requesting the states of the status lines. The electrical module monitors the state of the status lines and communicates the states back to the oscilloscope. Software in the oscilloscope includes a table of status line states and delay values that is accessed to modify the instrument display horizontal position display setting by the amount of the extender cable delay.

Currently, deskewing signals from various measurement probes requires the use of a deskew fixture or deskew algorithms that store specific nominal deskew time values for specific measurement probes in a table. In the former case, a user needs to purchase a deskew fixture in order to deskew signals. In the latter case, the user is restricted to the specific probe and deskew time values stored in the in the deskew algorithm table. A user is required to upgrade the deskew algorithm with a new table each time a new probe is introduced for the Power Measurement and Analysis Software.

What is needed is signal acquisition probe system that does not require the use of a deskew fixture for time aligning electrical signals from various signal acquisition probes. Further, the signal acquisition probe system should facilitate the introduction of new signal acquisition probes without the need for upgrading software to deskew the probe. Additionally, the signal acquisition probe system should provide a user with a display indicating the time the electrical signal is acquired at the device under test measurement point relative to the measurement test instrument trigger signal.

SUMMARY OF THE INVENTION

The above needs are met with a time shifting signal acquisition probe system where a signal acquisition probe has a memory containing a time delay value representative of the propagation time delay of an electrical signal passing through the signal acquisition probe. A measurement test instrument receives the electrical signal from the signal acquisition probe and generates digital samples of the electrical signal in an acquisition system and produces a waveform record in response to a trigger signal. The signal acquisition probe couples the time delay value to the measurement test instrument via a communications bus wherein processing circuitry in the measurement test instrument time shifts the waveform record of the electrical signal relative to the trigger signal by the amount of the signal acquisition probe time delay value.

In one embodiment of the time shifting signal acquisition probing system, the waveform record has a starting pointer index that is time shifted relative to the trigger signal by the amount of the signal acquisition probe time delay value by the processing circuitry. The processing circuitry further includes display circuitry receiving the stored waveform record and displaying a portion of the stored waveform record on a display device. The stored waveform record being displayed has a starting display pointer index into the stored waveform record and an ending display pointer into the stored waveform record. The displayed portion of the stored waveform record includes the digital samples of the stored waveform record from the starting display pointer index to the ending display pointer index.

The time shifting signal acquisition probe system may be implemented with a second signal acquisition probe having a memory containing a second signal acquisition probe time delay value representative of the propagation time delay of a second electrical signal through the second signal acquisition probe. The second signal acquisition probe couples the second electrical signal to the measurement test instrument that generates digital samples of the second electrical signal in a second acquisition system and produces a second waveform record in response to the trigger signal. The second signal acquisition probe time delay value is coupled to the measurement test instrument via a second communications bus wherein the processing circuitry time shifts the second waveform record of the second electrical signal relative to the trigger signal by the amount of the second signal acquisition probe time. The waveform records of the electrical signal and the second electrical signal are then substantially time aligned relative to the trigger signal.

The waveform records of the electrical signal and the second electrical signal each have a starting pointer index and preferably an ending pointer index that are time shifted relative to the trigger signal by the amount of the signal acquisition probe time delay value of the respective signal acquisition probe and the second signal acquisition probe. The display circuitry receives the waveform records of the electrical signal and the second electrical signal and displays a portion of each of the waveform records on a display device. The portions of the waveform records being displayed each has a starting display pointer index and an ending display pointer index into its respective waveform record. The displayed portion of each of the waveform records includes the digital samples of the waveform record from the starting display pointer index to the ending display pointer index.

In a further embodiment of the time shifting signal acquisition probe system, the processing circuitry in the measurement test instrument time shifts a portion of the waveform record relative to the trigger signal by the amount of the signal acquisition probe time delay value. The time shifted portion of the waveform record is received by the display circuitry and displayed on the display device. The portion of the waveform record being displayed has starting and ending display pointer indexes into the waveform record with the display pointer indexes time shifted relative to the trigger signal by the amount of the signal acquisition probe time delay value. The displayed portion of the waveform record includes the digital samples of the waveform record from the starting display pointer index to the ending display pointer index.

The processing circuitry in the measurement test instrument also time shifts a portion of the second waveform record relative to the trigger signal by the amount of the second signal acquisition probe time delay value. The time shifted portion of the second waveform record is received by the display circuitry and displayed on the display device. The portion of the second waveform record being displayed has starting and ending display pointer indexes into the second waveform record with the display pointer indexes time shifted relative to the trigger signal by the amount of the second signal acquisition probe time delay value. The displayed portion of the second waveform record includes the digital samples of the second waveform record from the starting display pointer index to the ending display pointer index. The portions of the waveform records of the electrical signal and the second electrical signal are substantially time aligned relative to the trigger signal.

The objects, advantages and novel features of the present invention are apparent from the following detailed description when read in conjunction with appended claims and attached drawings.

BRIEF DESCRIPTION OF THE DRAWINGS

FIGS. 3A through 3D illustrate the time shifting of a waveform record by the time delay value of the signal acquisition probe.

FIGS. 4A through 4C illustrate the time shifting of a displayed portion of a waveform record by the time delay value of the signal acquisition probe.

FIGS. 5A through 5G illustrates the time shifting of multiple waveform records by respective time delays of multiple signal acquisition probes.

FIGS. 6A through 6G illustrate the time shifting of displayed portions of multiple waveform records by respective time delays of multiple signal acquisition probes.

DETAILED DESCRIPTION OF THE INVENTION

Figure 1:
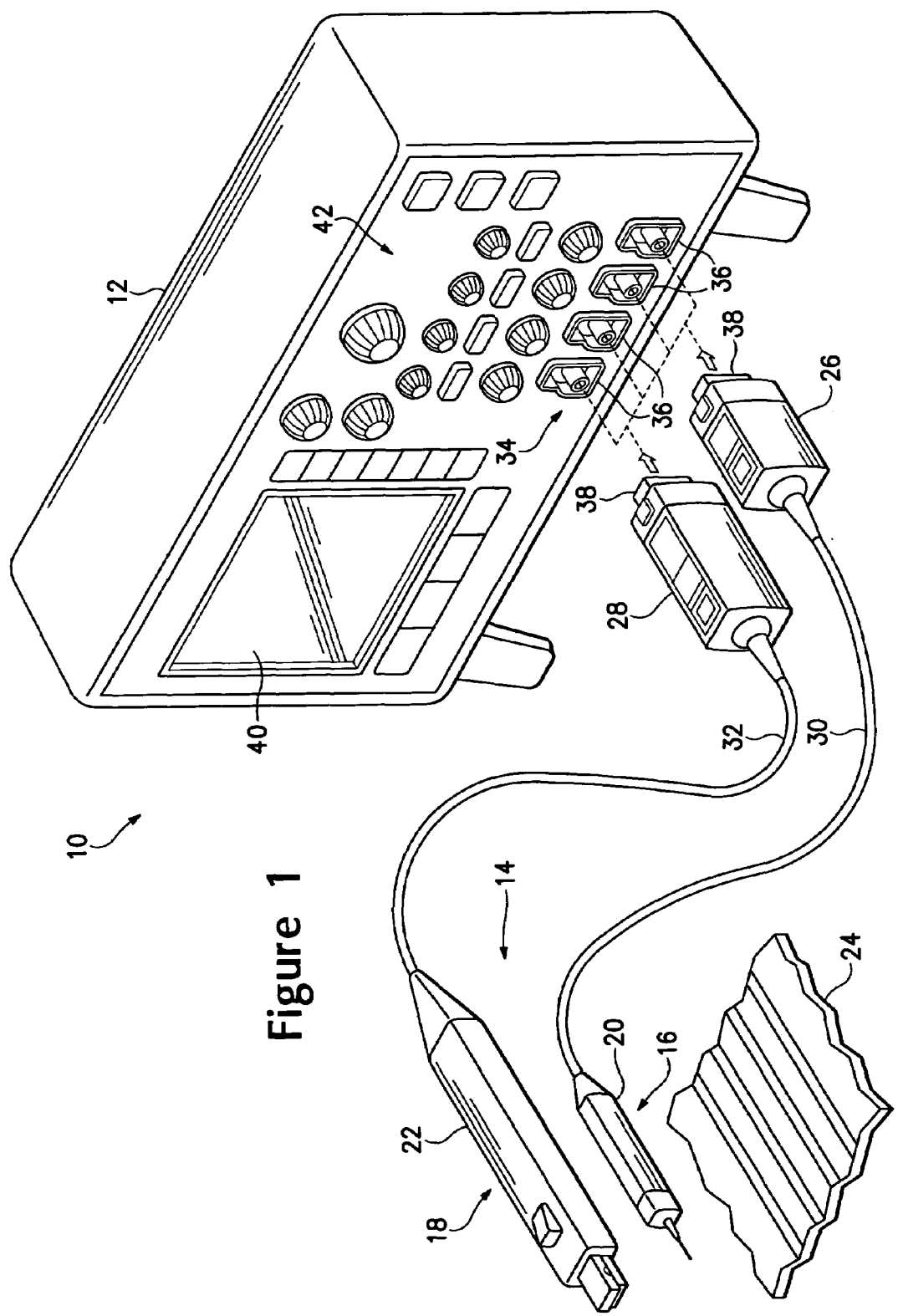
FIG. 1 is a perspective view of a measurement test instrument and signal acquisition probe implementing the time shifting signal acquisition probe system.

Referring to FIG. 1, the time shifting signal acquisition probe system 10 is implemented with a measurement test instrument 12, such as an oscilloscope or the like, and signal acquisition probes 14. The signal acquisition probes 14 may be implemented as voltage probes 16, current probes 18 or the like. The voltage probe 16 and the current probe 18 each have respective probing heads 20, 22 for acquiring voltage or current signals from a device under test 24. The electrical signals acquired by the probing heads 20, 22 are coupled to respective control boxes 26, 28 via signal cables 30 and 32. Each control box 26, 28 has electrical circuitry therein including a controller, memory and a communications bus. The control boxes 26, 28 are coupled to one of a number of input signal channel 34 of the oscilloscope 12. Each input signal channels 34 has a receptacle interface 36 with each interface having electrically conductive contacts and a coaxial signal jack. The control boxes 26, 28 have plug interfaces 38 that mates with the receptacle interfaces 36 and has electrical contacts and a coaxial signal jack that interface with the corresponding electrical contacts and coaxial signal jack in receptacle interfaces 36. The interfaces 36 and 38 provide electrical power to the voltage and current probes 16, 18 as well as providing communications between the voltage and current probes 16, 18 and the oscilloscope 12. The interfaces 36 and 38 also provide a signal path between the voltage and current probes 16, 18 and the oscilloscope 12 for the electrical signals acquired from the device under test 24. The oscilloscope 12 is provided with a display device 40, such as a liquid crystal display, cathode ray tube or the like for displaying representations of the electrical signal acquired from the device under test 24.

The oscilloscope also includes a front panel interface 42 having knobs, buttons and the like for controlling the operation of the oscilloscope 12.

Figure 2:
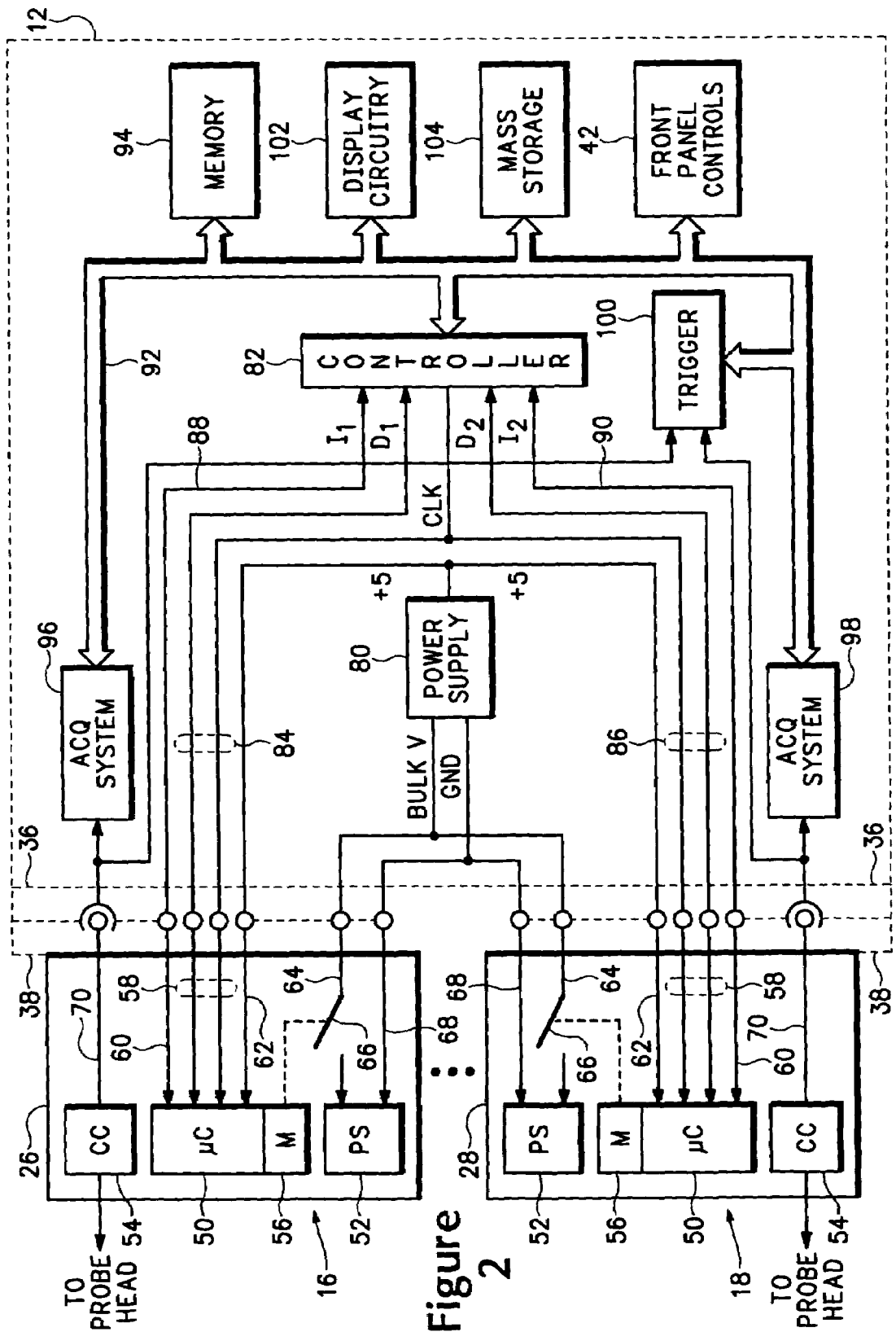
FIG. 2 is a representative block diagram of an oscilloscope and signal acquisition probes implementing the time shifting signal acquisition probe system.

Referring to FIG. 2, there is a representative block diagram of the oscilloscope 12 and the signal acquisition probes 14 (e.g. voltage probe 16 and current probe 18) that implement the time shifting signal acquisition probe system 10. Two representative signal channels are shown in the block diagram but it is understood that any number of signal channels may be included in the oscilloscope 12 with each channel having separate acquisitions systems. Each of the electrical signals coupled to the signal channels are also coupled to trigger circuitry 100 in the oscilloscope 12. The control boxes 26, 28 each have a controller 50, a power supply circuit 52 and control box circuitry 54. The control box controllers 50 may include an embedded memory 56 or a separate memory device may be included that is coupled to the controller 50. The control box controller 50 has a communications bus 58, such as an I$^2$C bus, IEEE 1494 bus, USB bus or the like, that provides bi-directional communications. Preferably the communications bus includes a clock line and a data line coupled to the plug interface 38. The control box controllers 50 also has an interrupt line 60 coupled to the plug interface 38. A low power supply voltage is provided to the control box controller 50 and memory 56 via a low voltage power supply line 62 coupled to the plug interface 38. A bulk voltage is provided to the control box power supply circuit 52 via a bulk voltage supply line 64 coupled to the plug interface 38. A switch 66 is disposed in the bulk voltage supply line 64 and is activated by commands sent by the control box controller 50. Preferably, the switch 66 is an electronic switch but other types of switches may be used, such a electromechanical switches and the like. A ground line 68 coupled to the plug interface 38 provides electrical ground to the signal acquisition probes 14.

The control box circuitry 54 receives at least a first regulated voltage supply from the control box power supply 52. Preferably, the control box power supply 52 provides a variety of voltages to the control box circuitry 54 depending on the voltage requirements of the circuitry. For example, the control box power supply may provide 7 volts, 15 volts, 25 volts or any set of voltages by the control box circuitry 54. The regulated voltages provided to the control box circuitry 54 are by example only and other voltage levels may be provided. The control box circuitry 54 is also coupled to receive commands from the control box controller 50. The control box circuitry 54 may be coupled to receive acquired signals from a device under test 24 via the signal acquisition probing heads 20, 22 of the voltage and current probes 16 and 18. The acquired signals are coupled via signal line 70 to the coaxial signal jack of the plug interface 38.

The oscilloscope 12 has a power supply 80 providing a bulk power supply output to the power supply circuits 52 of the control boxes 26, 28 via receptacle interface 36 and the switch 66. The bulk power supply output is a slightly regulated voltage that preferably ranges from +10 to +14 volts with a nominal voltage of +12 volts. The power supply 80 also generates a low power supply output, generally +5 volts, that is provided to the control box controllers 50 and memories 56 through the receptacle interface 36. The oscilloscope 12 has a controller 82 that is coupled to communication buses 84 and 86 and interrupt lines 88 and 90. The communications buses 84, 86 and interrupt line 88, 90 are coupled to the receptacle interfaces 36. The communications buses 84, 86 provides bi-directional communications with the control boxes 26, 28 and may take the form of an I$^2$C bus, IEEE 1494 bus, USB bus or the like. Preferably the communication buses 84, 86 includes a clock line and a data line coupled to the receptacle interface 36.

The oscilloscope controller 82 is coupled via a system bus 92 to memory 94 and acquisition systems 96 and 98. The memory 94 represents both RAM, ROM and cache memory with the RAM memory storing volatile data, such as digital samples of the electrical signals generated by the acquisition systems 96 and 98 coupled to receive the electrical signals from the voltage and current probes 16, 18. The system bus 92 is coupled to the trigger circuitry 100 that also receives the electrical signals from the voltage and current probes 16, 18. The system bus 92 is also coupled to display circuitry 102 for generating a display output on the display device 40, and to the front panel controls 42. A mass storage unit or units 104, such as a hard disk drive, CD ROM drive, tape drive, floppy drive or the like that reads from and/or writes to appropriate mass storage media, may also be connected to the system bus 92. Program instructions for controlling the oscilloscope 12 and implementing the time shifting signal acquisition probe system 10 may be stored and accessed from the ROM memory 94 or from the mass storage media of the mass storage unit 104. The oscilloscope controller 82 may also be implemented using multiple controllers and digital signal processing devices. For example, a second controller, such as a Power PC microprocessor manufactured and sold by Motorola, Inc., Schaumburg, Ill., may be included to control the acquisition and processing of the electrical signals. The display circuitry may include display controller receiving display instructions from a oscilloscope controller 82 and receiving display data from a digital signal processing device. A bus controller may also be included to monitor the receptacle interface 36 for connected signal acquisition probes 14, and provide communications between the control box controllers 50 and the oscilloscope controller 82.

The electrical signals acquired by the voltage and current probes 16 and 18 propagate through the respective probes 16, 18 at different rates of time. Generally, the signal cables 30 and 32 contribute the most propagation delay time to the electrical signals. Nominal time delay values based on the propagation time delay of the signal cables 30, 32 are determined and stored in the memories 56 of the respective control boxes 26 and 28 of the voltage and current probes 16 and 18. In an alternative and preferred implementation, the propagation time delays of each probe 16, 18 from the probing tip or tips on the probing heads 20 and 22 of the probes 16, 18 to the plug interfaces 38 of the probes 16, 18 are determined during the probes factory calibration and the resulting time delay values are stored in the memories 56 of the respective control boxes 26 and 28.

When one of the signal acquisition probes 14, such as the voltage probe 16 is plugged into one of the receptacle interfaces 36, the low power supply output from the oscilloscope 12 is coupled to the control box controller 50 and associated memory 56. The plugging in of the voltage probe 16 into the receptacle interface 36 results in an interrupt request to the oscilloscope controller 82 via interrupt line 88. The oscilloscope controller 82 initiates a data request to the control box controller 50 via the communications bus 84. The control box controller 50, in return, reads probe parameter data including the propagation time delay value from the memory 56 and passes the parameter data back to the oscilloscope controller 82 via the communications bus 84. The oscilloscope controller 82 examines the parameter data to determine if the connected voltage probe 16 is a valid and supported by the oscilloscope 12. If the voltage probe 16 is a valid and supported probe, the oscilloscope controller 82 initiates commands on the communications bus 84 that are received by the control box controller 50 via control box communications bus 58. The control box controller 50 initiates commands that results in the switch 66 in the bulk voltage supply line 64 closing and coupling the bulk power supply voltage from the oscilloscope power supply 80 to the control box power supply circuit 52.

The probing head 20 of the voltage probe 16 is placed on a test point on the device under test 24 to acquire an electrical signal 140. The electrical signal 140 is coupled through the voltage probe 16 to the acquisition system 96 in the oscilloscope 12. The acquisition system 96 digitizes the received electrical signal 140 and stores the resulting digital samples in a circular buffer 110 as represented in FIG. 3A. The digital samples of the electrical signal 140 illustrates a single rising edge by example only, and other types of electrical signal having multiple transitions are contemplated. The number of transitions of the electrical signal 140 acquired in the circular buffer 110 is a function of the type of electrical signal being acquired and the setting of the acquisition system, such as time-per-division, sample rate and the like. The digital samples are time dependent values with the circular buffer 110 storing the last acquired digital value subsequent to the previous value. The electrical signal 140 is also coupled to trigger circuitry 100 for generating a trigger signal 112, shown in FIG. 3B. The trigger circuitry 100 is set-up by a user using front panel controls 42 on the oscilloscope 12 to trigger at a certain threshold level 114 on a rising or falling portion of the electrical signal 140 as depicted in FIG. 3A. The user sets the hold-off and pre-trigger to allows the for the accumulation of digital samples prior to a trigger signal 112. The trigger circuitry 100 is armed after the hold-off time as depicted at 115 and the next occurrence of the electrical signal 140 that matches the trigger parameters results in the trigger signal 112 changing states as depicted at 116 in FIG. 3B. The circular buffer 110 continues to receive digital samples from the acquisition system 96 until a post trigger time has expired at which time the digital samples in circular buffer 110 is transferred to the memory 94 and stored as a waveform record 118 as represented by FIG. 3C. The circular buffer 110 may be a part of the memory 94 or the acquisition system 96 may have its own circular buffer memory. The trigger signal 112 returns to its previous unarmed state until the trigger circuitry 100 is armed at which time the trigger signal 112 returns to the armed state. The trigger signal 112 is shown changing from a low state to a high state but the trigger signal 112 may equally change from a high state to a low state.

The oscilloscope 12 design dictates the size of the waveform record 118. In the below description, the waveform record 118 is assumed to contain one million data samples but other waveform record sizes are contemplated. Additional digital samples 120, 122 before and after the waveform record 118 are stored in memory 94 from the circular buffer 110 to allow displaying the complete waveform record 118 without the loss of digital samples at the beginning and end of the waveform record 118. The display circuitry 102 retrieves the waveform record 118 from the memory 94 and formats the digital samples of the waveform record 118 and displays a portion 124 of the waveform record 118 on the display device 40 as represented by the vertical xs in FIG. 3C. In the preferred embodiment, the displayed portion 124 of the waveform record 118 is initially centered around the trigger point 126 in the waveform record 118. In the preferred embodiment, the displayed portion 124 of the waveform records contains 500 digital data samples but a different number of digital samples may be displayed without departing from the scope of the present invention.

The waveform record 118 preferably has a starting pointer index 128 and an ending pointer index 130 and the displayed portion 124 of the waveform record 118 preferably has a starting display pointer index 132 and an ending display pointer index 134. Alternatively, the waveform record 118 and the displayed portion 124 of the waveform record 118 have respective starting pointer index 128 and a starting display pointer index 132 and counters in the oscilloscope processing circuitry and display circuitry 102 that keep track of the number of digital samples in the waveform record 118 from the starting pointer index 128 and the number of digital samples from the starting display pointer index 132. The oscilloscope processing circuitry includes the oscilloscope controller 82 and associated software algorithms stored in memory 94 or retrieved from the mass storage device 104 that perform various processing functions on the waveform record or application specific integrated circuits that perform the various processing functions in conjunction with the oscilloscope controller 82 and the associated software algorithms.

The starting and ending pointer indexes 124 and 126 of the waveform record 118 as well as the display starting and ending pointers 132 and 134 of the displayed portion 124 of the waveform record 118 are referenced to the trigger signal 112. As previously stated, the voltage probe 16 has a propagation time delay which results in electrical signal from the device under test 24 being delayed to the acquisition system 96 and the trigger circuitry 100 by the amount of the voltage probe 16 propagation time delay. The resulting trigger signal 112 and stored waveform record 118 are referenced to the oscilloscope 12 input channels and not to the device under test 24. The dashed waveform 136 in FIG. 3A represents the rising edge of the electrical signal at the device under test 24 prior to the propagation delay caused by the voltage probe 16. The time delay value representing the propagation time delay of the voltage probe 16, read into the oscilloscope 12 from the memory 56 of the voltage probe control box 26, is automatically applied to starting and ending pointer indexes 128 and 130 of the waveform record 118 to shift the waveform record 118 relative to the trigger signal 112 by the amount of the time delay value. For example, the voltage probe 16 has a time delay value of 5 nsec which means the rising edge of the electrical signal 140 occurred at the device under test 5 nsec prior to the trigger signal 112 as represented by the dashed waveform 136. The time delay value of 5 nsec is applied to the starting and ending pointer indexes 128 and 130 of the waveform record 118 as represented in FIG. 3D. While the starting and ending points of the waveform record 118 have been changed by 5 nsec, the trigger point of the trigger signal 112 remains fixed within the waveform record 118. The result is that the displayed portion 124 of the waveform record 118 has the rising edge of the electrical signal 140 shifted by the 5 nsec of the time delay value relative to the trigger point 126 of the trigger signal 112 as represented by the display trigger icon 138 with the electrical signal positioned relative to the trigger point 126 to reflect the acquisition of the electrical signal 140 at the device under test 24.

An alternative to shifting the starting and ending pointer indexes 128 and 130 of the waveform record 118 is to shift the starting and ending display pointers indexes in the displayed portion 124 of the waveform record 118. FIG. 4A is the same as FIG. 3C illustrating the waveform record 118 and the displayed portion 124 of the waveform record 118. The starting and ending display pointer indexes are positioned equidistant from the trigger point 126 in the waveform record 118. FIG. 4B illustrates the shifting of the starting and ending display pointer indexes 132 and 134 in the waveform record 118 by the amount of the time delay value of 5 nsec representing the propagation time delay of the voltage probe 16. FIG. 4C illustrates the results of time shifting the starting and ending display pointer indexes 132 and 134 on the displayed portion 124 of the waveform record 118. The rising edge of the electrical signal 140 is time shifted 5 nsec relative to the trigger point 126 of the trigger signal 112 as represented by the trigger display icon 138. As previously stated, the trigger point remains fixed in time within the waveform record 118 irrespective of the shifting of the starting and ending display indexes 132 and 134 with the display circuitry 102 automatically positioning the displayed portion 124 of the waveform record 124 around the trigger point 126 as represented by the trigger display icon 138. The result is that the rising edge of the electrical signal 140 is positioned relative to the trigger point 126 to reflect the acquisition of the electrical signal at the device under test 24.

Figure 5C:
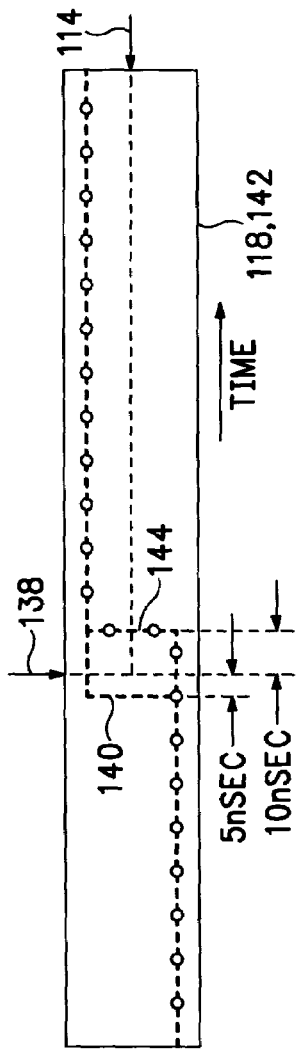
Figure 5D:
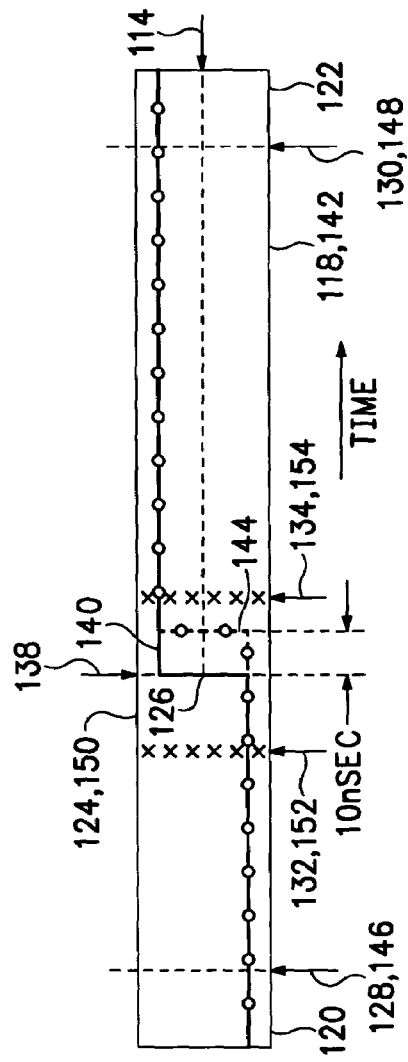

The time shifting of the waveform record 118 or the displayed portion 124 of the waveform record 118 automatically occurs for each signal acquisition probe 14 coupled to the oscilloscope 12 implementing the time shifting signal acquisition probe system 10. FIGS. 5A through 5G illustrates the time shifting signal acquisition probe system 10 for both the voltage probe 16 and the current probe 18. Like elements from the previous drawing are labeled the same in FIGS. 5A through 5G. In this example, the voltage probe 16 has a stored time delay value of 5 nsec and the current probe 18 has a stored time delay value of 15 nsec. The oscilloscope trigger circuitry is set-up to trigger on the electrical signal 140 from the voltage probe 16 as represented in FIG. 5B. This results in a trigger signal 112 on the rising edge of the electrical signal 140 from the voltage probe 16. FIG. 5C illustrates the electrical signal 140 form the voltage probe 16 and an overlapping electrical signal 144 from the current probe 18 at the device under test 24 in relation to the trigger signal 112. The electrical signal 140 from the voltage probe 16 precedes the trigger signal 112 by 5 nsec due to the propagation time delay of the voltage probe 16 and the electrical signal 144 from the current probe 18 is delayed after the trigger signal by 10 nsec due to the propagation time delay of the current probe 18. FIG. 5D is an illustration of overlapped waveform records 118, 142 of the electrical signals 140, 144 of both the voltage probe 16 and the current probe 18 overlain on each other. The waveform record 142 has starting and ending pointer indexes 146 and 148 into the waveform record. The electrical signal 144 of the current probe 18 is offset from the triggered electrical signal 140 of the voltage probe 16 by 10 nsec which is the difference between the 5 nsec delay in the electrical signal 140 to the acquisition circuitry 96 and trigger circuitry 100 and the 15 nsec delay of the electrical signal 144 to acquisition circuitry 98.

Figure 5E:
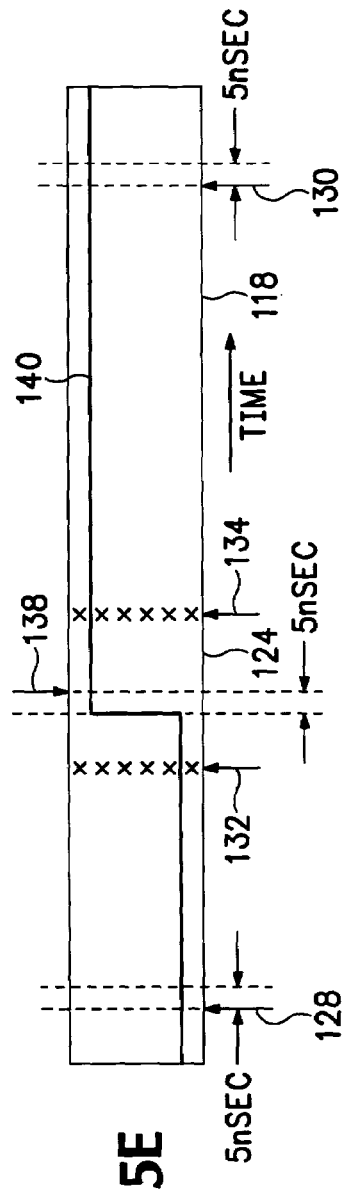

FIG. 5E illustrates the automatic shifting of the starting and ending pointer indexes 128 and 130 of the waveform record 118 by the 5 nsec the time delay value of the voltage probe 16. FIG. 5F illustrates the automatic shifting of the starting and ending pointer indexes 146, 148 of the waveform record 142 by the 15 nsec time delay of the current probe 18. FIG. 5G illustrates the results of the time shifting of the starting and ending pointer indexes 128, 146, 130, 148 of the waveform records 118 and 142 by the time delay values for the respective voltage and current probes 16 and 18. The electrical signal 140 of the voltage probe 16 has been shifted 5 nsec relative to the trigger point 126 as represented by the trigger display icon 138 and the electrical signal 144 of the current probe has been shifted 15 nsec relative to trigger point 126 as represented by the trigger display icon 138. The shifting of the electrical signals 140 and 144 by the respective time delay values of the voltage and current probes 16 and 18 results in the overlapping or deskewing of the rising edges of the two electrical signals 140 and 144 with the electrical signals 140 and 144 positioned relative to the trigger point 126 to reflect the acquisition of the electrical signals 140 and 144 at the device under test 24.

Figure 6B:
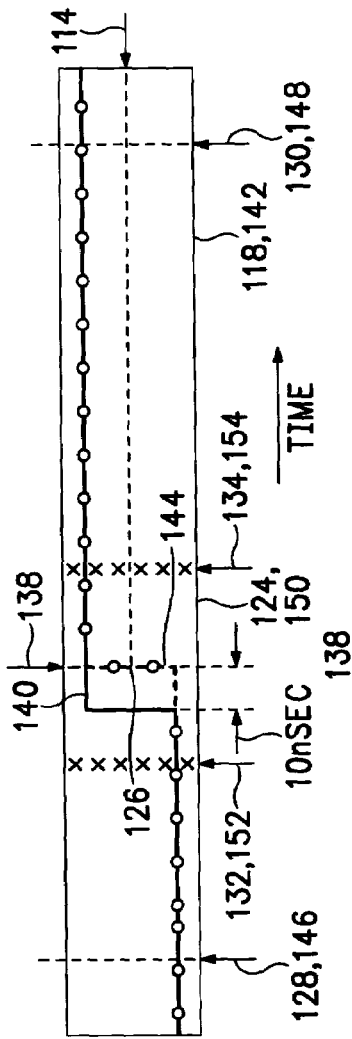
Figure 6C:
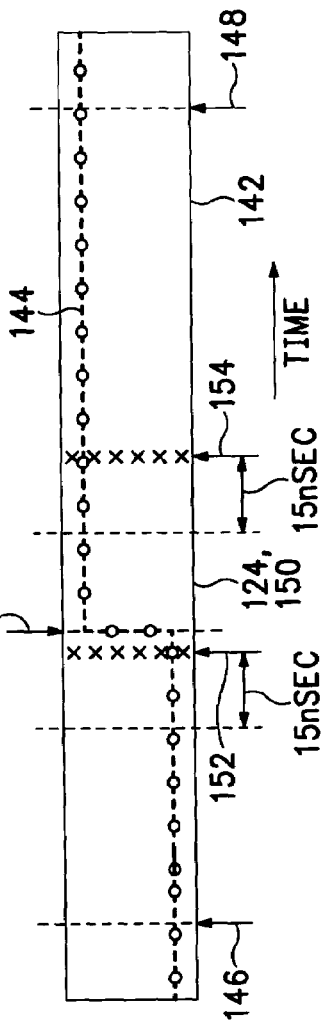
Figure 6D:
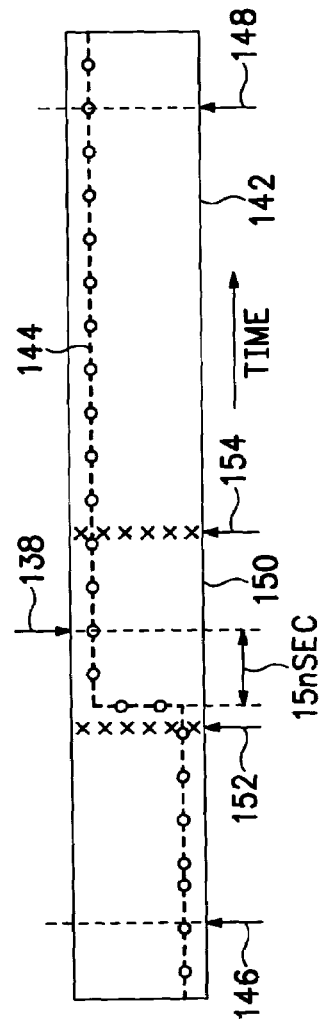

FIGS. 6A through 6G illustrate the time shifting of displayed portions 124, 150 waveform records 118, 142 by the time delay values of the voltage and current probes 16 and 18. Like elements from the previous drawing are labeled the same in FIGS. 6A through 6G. In this example, the trigger circuitry 100 is set-up to trigger on the electrical signal 144 from the current probe 18. This results in a trigger signal 112 on the rising edge of the electrical signal 144 from the current probe 18 as represented in FIG. 6A. FIG. 6B illustrates the triggered waveform record 142 of the electrical signal 144 from the current probe 18 and the overlapping waveform record 118 the electrical signal 140 from the voltage probe 16 referenced to the trigger signal 112. As seen in the illustration, the electrical signal 140 of the voltage probe 16 leads the triggered electrical signal 144 of the current probe 18 by 10 nsec. FIG. 6C illustrates the shifting of the starting and ending display pointer indexes 152 and 154 of the displayed portion 150 of the waveform record 142 of the electrical signal 144 of the current probe 18 by the amount of the time delay value of 15 nsec representing the propagation time delay of the current probe 18. FIG. 6D illustrates the results of time shifting the starting and ending display pointer indexes 152 and 154 on the displayed portion 150 of the waveform record 142. The rising edge of the electrical signal 144 is time shifted 15 nsec relative to the trigger point of the trigger signal 112 as represented by the display trigger icon 138. As previously stated, the trigger point remains fixed within the waveform record 142 irrespective of the shifting of the starting and ending display indexes 152 and 154 with the display circuitry 102 automatically positioning the displayed portion 150 of the waveform record 142 around the trigger point 126 as represented by the display trigger icon 138.

Figure 6E:
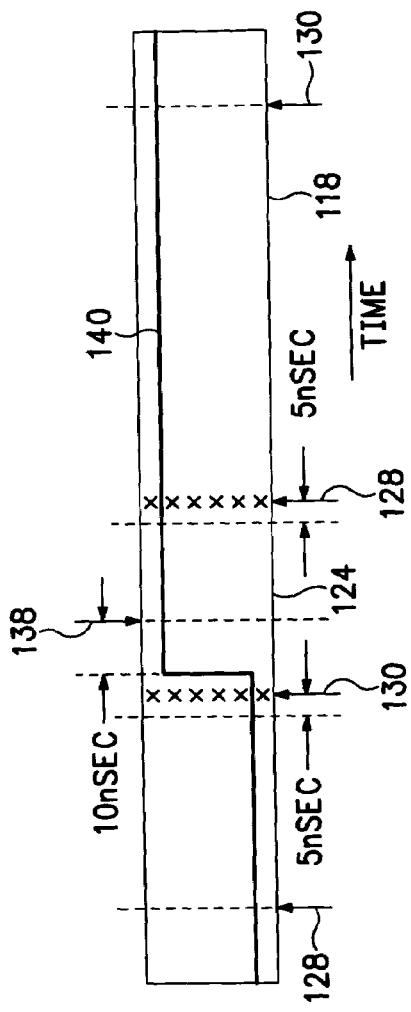
Figure 6F:
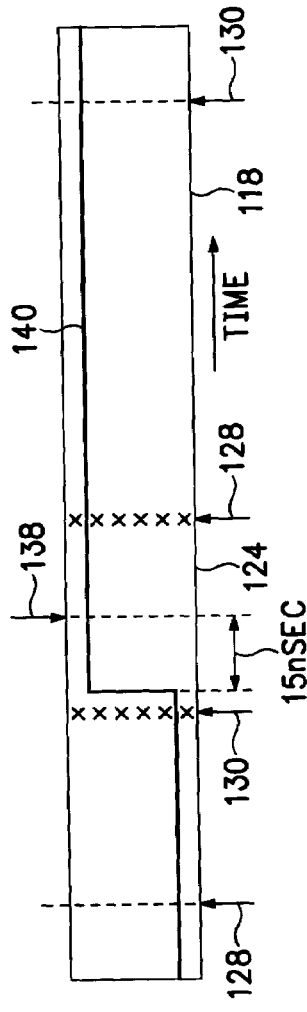
Figure 6G:
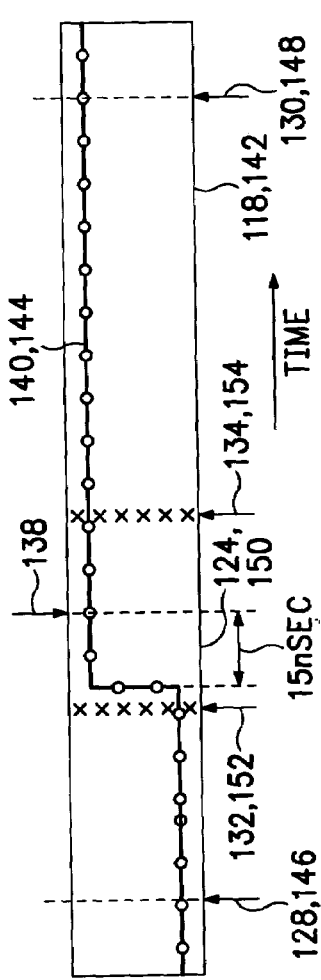

FIG. 6E illustrates the shifting of the starting and ending display pointer indexes 128 and 130 of the displayed portion 124 of the waveform record 118 of the electrical signal 140 of the voltage probe 16 by the amount of the time delay value of 5 nsec representing the propagation time delay of the voltage probe 16. FIG. 6F illustrates the results of time shifting the starting and ending display pointer indexes 128 and 130 on the displayed portion 124 of the waveform record 118. The rising edge of the electrical signal 140 is time shifted a total of 15 nsec relative to the trigger point 126 as represented by the display trigger icon 138. The total time shift of the electrical signal 140 is the initial time shift of 10 nsec of the electrical signal 140 preceding the triggered electrical signal 144 of the current probe 18 due to the current probe 18 having a greater propagation time delay and the 5 nsec time shift of the time delay value of the voltage probe 16. The trigger point 126 as represented by the trigger display icon 138 remains fixed in time within the waveform record 140 irrespective of the shifting of the starting and ending display indexes 132 and 134 with the display circuitry 102 automatically positioning the displayed portion 124 of the waveform record 140 around the trigger point 126. FIG. 6G illustrates the results of the time shifting of the starting and ending display pointer indexes 132, 152, 134, 154 of the displayed portions 124, 150 of the waveform records 118 and 142 by the time delay values for the respective voltage and current probes 16 and 18. The electrical signal 144 of the current probe 18 has been shifted 15 nsec relative to the trigger point as represented by the display trigger icon 138 and the electrical signal 140 of the voltage probe 16 has been shifted 5 nsec relative to the trigger point as represented by display trigger point 138. The shifting of the electrical signals 144 and 140 by the respective time delay values of the current and voltage probes 18 and 16 results in the overlapping or deskewing of the rising edges of the two electrical signals 140 and 144 with the electrical signals 140 and 144 positioned relative to the trigger point 126 to reflect the acquisition of the electrical signals 140 and 144 at the device under test 24.

In a further embodiment of the time shifting signal acquisition probe system, one waveform record or displayed portion of a waveform record may be time shifted relative to another waveform record or displayed portion of a waveform record. In such an embodiment, the waveform record of the assigned trigger channel is designated as the reference waveform record. The other waveform record or records are time shifted relative to the reference waveform record using the stored time delay values of signal acquisition probes. For example, the oscilloscope 12 is set-up to trigger on the electrical signal 140 acquired using the voltage probe 16 having a time delay value of 5 nsec as shown in FIGS. 5A and 5B. The resulting waveform record 118 is not time shifted relative to the trigger signal 112 by the time delay value of the voltage probe 16. The current signal 144 is acquired in waveform record 142 using the current probe 118 having a time delay value of 15 nsec. As shown in FIG. 5C, the electrical signal 144 from the current probe 18 is delayed after the trigger signal by 10 nsec due to the propagation time delay of the current probe 18. To shift the waveform record 142 of the current probe 18 to overlay the waveform record 118 of the voltage probe 16 requires the time shifting the starting and ending pointer indexes 146 and 148 of the waveform record 144 or the starting and ending display pointer indexes 152 and 154 of the displayed portion 150 of the waveform record 142 by 10 nsec. This is accomplished by subtracting the time delay value of the current probe 18 from the time delay value of the voltage probe 16 resulting in a time delay of −10 nsec. The minus sign indicates the automatic shifting by 10 nsec of the starting and ending pointer indexes 146 and 148 of the waveform record 142 to earlier points in the acquired waveform record or the automatic shifting by 10 nsec of the starting and ending display pointer indexes 152 and 154 of the displayed portion 150 of the waveform record 142 earlier in the waveform record 144.

Likewise, when the oscilloscope 12 is set-up to trigger on the electrical signal 144 of the current probe 18, the resulting waveform record 142 of the current probe 18 is not time shifted relative to the trigger signal 112 by the time delay value of the current probe 18. Since the propagation time delay of the voltage probe 16 is less than the propagation time delay of the current probe 18, the waveform record 118 of the electrical signal 140 from the voltage probe 16 precedes the waveform record 142 of the current probe 18 by 10 nsec. To shift the waveform record 118 of the voltage probe 16 to overlay the waveform record 142 of the current probe 18 requires the time shifting the starting and ending pointer indexes 128 and 130 of the waveform record 118 or the starting and ending display pointer indexes 132 and 134 of the displayed portion 124 of the waveform record 118 by 10 nsec. This is accomplished by subtracting the time delay value of the voltage probe 16 from the time delay value of the current probe 18 resulting in a time delay of +10 nsec. The plus sign indicates the automatic shifting by 10 nsec of the starting and ending pointer indexes 128 and 130 of the waveform record 118 to later points in the acquired waveform record 118 or the automatic shifting by 10 nsec of the starting and ending display pointer indexes 132 and 134 of the displayed portion 124 of the waveform record 118 later in the waveform record 118.

Figure 7:
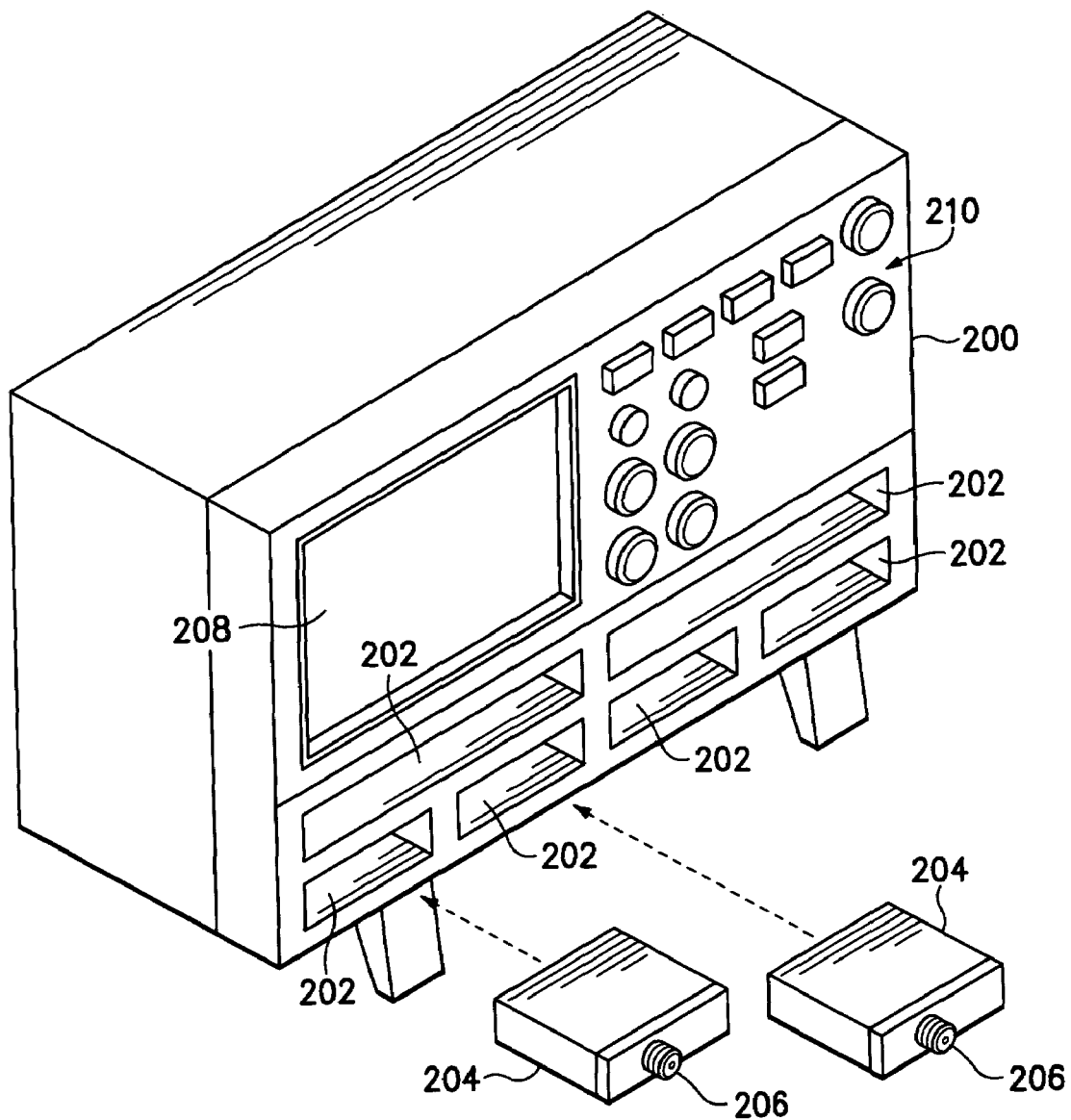
FIG. 7 is a perspective view of a sampling oscilloscope and associated electrical modules implementing the time shifting signal acquisition module system.

The present invention may also be implemented in a sampling oscilloscope 200, such as the DSA8200 Digital Serial Analyzer Sampling Oscilloscope, manufactured and sold by Tektronix, Inc., Beaverton, Oreg. FIG. 7 is a perspective view of the sampling oscilloscope 200 having has a modular architecture that includes multiple bays 202 for receiving various types of optical and electrical plug-in modules 204. Each bay 202 include an electrical interface that mate with a corresponding electrical interface in the optical and electrical plug-in modules 204 for providing electrical power, control and communication signals and signal output for the modules. The 80E06 Single Channel Sampling Module is an example of the electrical plug-in modules 204 with each module have an electrical input 206 for receiving electrical signals from a device under test. The sampling oscilloscope 200 is provided with a display device 208, such as a liquid crystal display, cathode ray tube or the like for displaying representations of electrical signals acquired from s device under test. The oscilloscope also includes a front panel interface 210 having knobs, buttons and the like for controlling the operation of the sampling oscilloscope 200.

Figure 8:
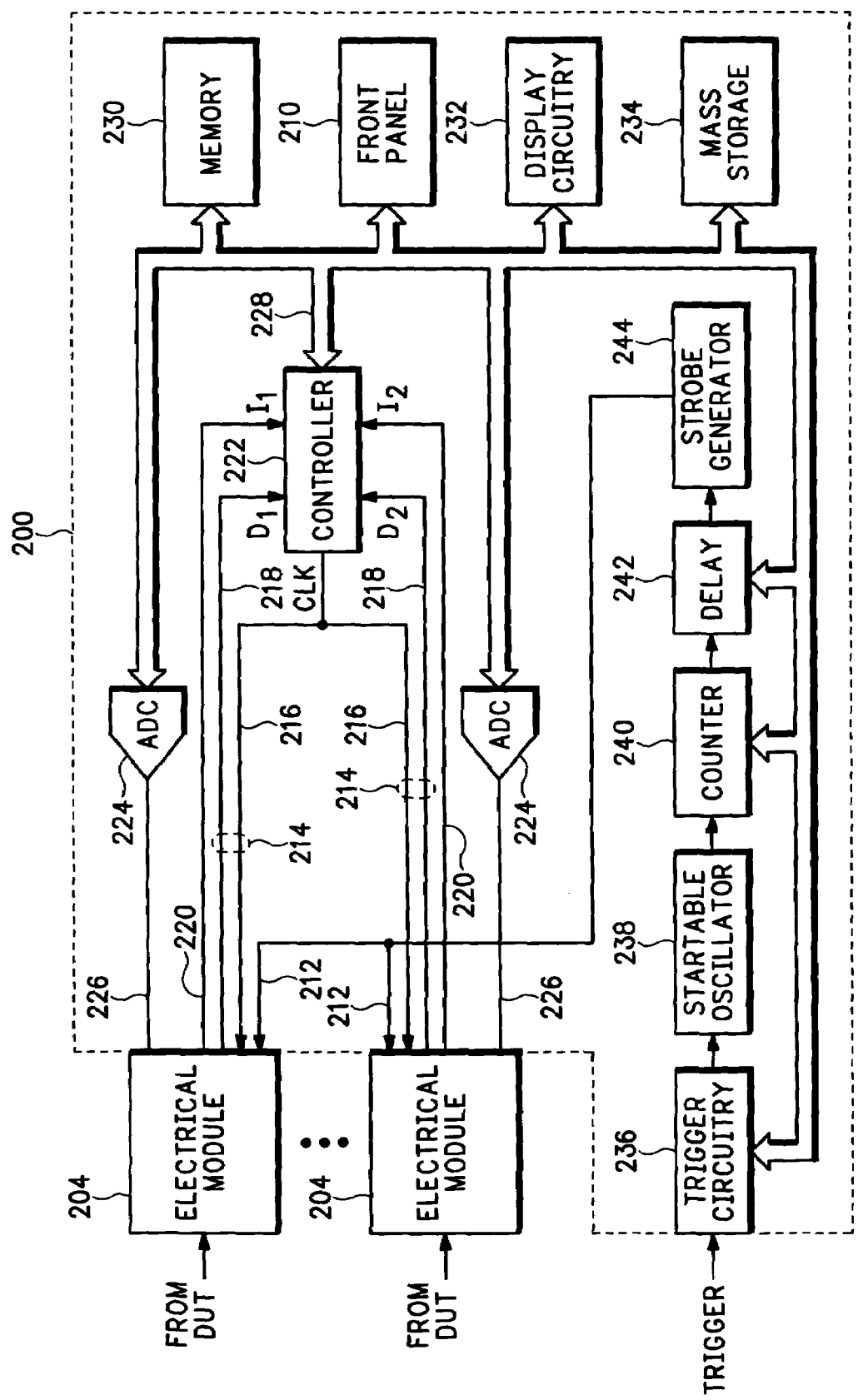
FIG. 8 is a representative block diagram of the sampling oscilloscope implementing the time shifting signal acquisition module system.

Referring to FIG. 8, there is shown a simplified block diagram of the sampling oscilloscope 200. The electrical modules 204 are coupled to the sampling oscilloscope 200 by respective electrical interfaces. The sampling oscilloscope provides a sampling strobe via a strobe signal lines 212 to each electrical module 204 as well as providing bi-directional serial communications with the electrical modules via communication buses 214, such as an I$^2$C bus or the like. The communication buses 214 include a clock line 216 and a data line 218. An interrupt line 220 is provided for each of the optical or electrical modules for receiving an interrupt signal from each optical or electrical module. The communications buses 214 and the interrupt lines 220 are coupled to an oscilloscope controller 222. Each electrical module 204 samples an electrical signal from a device under test and couples the signal samples to respective analog-to-digital converters (ADC) 224 via signal lines 226.

The oscilloscope controller 222 is coupled via a system bus 228 to memory 230 and the ADCs 224. The memory 230 represents both RAM, ROM and cache memory with the RAM memory storing volatile data, such as digital samples of the sampled electrical signals generated by the ADCs 224. The system bus 230 is also coupled to the front panel controls 210 and to display circuitry 232 for generating a display output on the display device 208. A mass storage unit or units 234, such as a hard disk drive, CD ROM drive, tape drive, floppy drive or the like that reads from and/or writes to appropriate mass storage media, may also be connected to the system bus 228. Program instructions for controlling the sampling oscilloscope 200 and implementing the present invention may be stored and accessed from the ROM memory 230 or from the mass storage media of the mass storage unit 234. The sampling oscilloscope controller 222 may also be implemented using multiple controllers and digital signal processing devices. For example, a second controller, such as a Power PC microprocessor manufactured and sold by Motorola, Inc., Schaumburg, Ill., may be included to control the acquisition and processing of the electrical signals. The display circuitry may include display controller receiving display instructions from the sampling oscilloscope controller 222 and receiving display data from a digital signal processing device. A bus controller may also be included to monitor the electrical interface of each bay 202 for connected optical or electrical modules 204, and provide communications between the optical or electrical modules 204 and the sampling oscilloscope controller 222.

The system bus 228 is coupled to the trigger circuitry 236 that receives an external trigger signal. The trigger circuitry 236 initiates the generation of a clock signal from a startable oscillator 238 that is coupled to a counter 240. The counter 240 is coupled via the system bus 228 to the controller 222 that loads coarse time delay values into the counter 240. The output strobe from the counter 240 is coupled to a fine delay circuit 242. The fine delay circuit 242 is coupled via the system bus 228 to the controller 222 that load fine delay values in the fine delay circuit 242. The fine delay circuit 242 delays the received strobe signal by an amount set by the fine delay value received from the controller 222. The delayed output strobe from the fine delay circuit is coupled to the strobe generator 244 which generates a strobe signal consisting of strobe pulses that are coupled to the optical or electrical modules 204 via the strobe signal lines 212. The combination of the course and fine time delays loaded into the counter and the fine delay circuits 240 and 242 provide accurate sampling of input signals.

Figure 9:
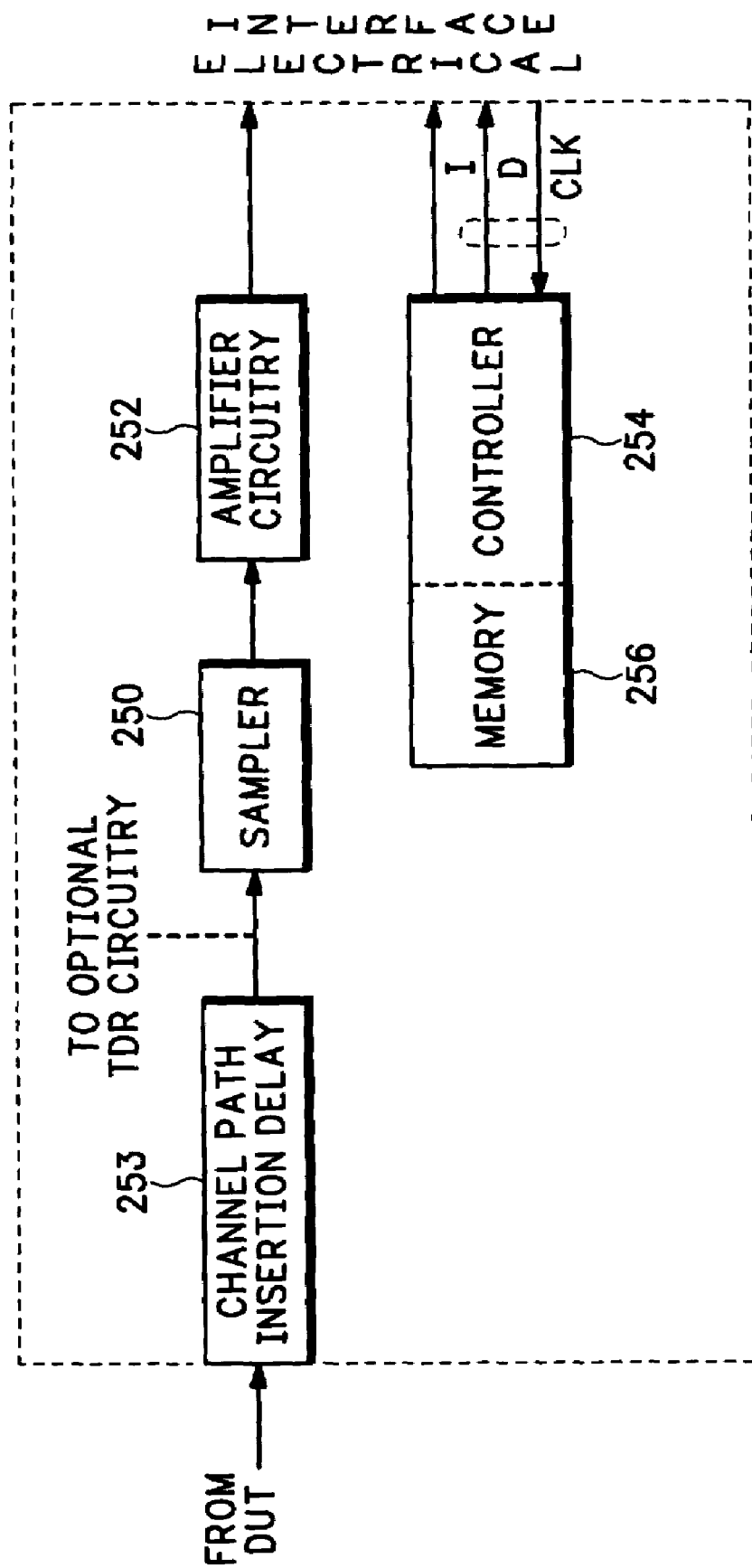
FIG. 9 is a representative block diagram of the electrical module used with the sampling oscilloscope implementing the time shifting signal acquisition module system.

The sampling oscilloscope is factory calibrated to account for propagation delays in the signal paths 226 and strobe signal lines 212 coupled to the optical or electrical module interfaces. However, each optical or electrical module also has propagation delays associated with its signal path and strobe signal path. Referring to FIG. 9, there is shown a representative block diagram of a single channel electrical module 204. An input electrical signal from a device under test is coupled to a sampler 250 that also receives the strobe signal. The samples of the electrical signal are coupled to amplifier circuitry 252 that amplifies the samples and couples the samples to the ADC 224 in the sampling oscilloscope 200 via the electrical module interface. The sampler 250 and the amplifier circuitry 250 are similar to those described in U.S. Pat. No. 6,392,219 and incorporated herein by reference. The channel path insertion delay 253 represent the propagation delay from the sampler input to the acquisition point in the electrical module 204. The electrical module 204 includes a controller 254 that is coupled to the sampling oscilloscope controller 222 via the communication bus 214 and the interrupt line 220. The electrical modules controller 222 may include embedded memory 256 or a separate memory device coupled to the controller 254.

The electrical module 204 is factory calibrated to determine the various delay parameters associated with that particular module. For example, the signal propagation delay or channel path insertion delay is calculated and stored in memory 256. The propagation delay of the strobe signal in the electrical module is calculated and stored in memory 256. Depending on the type of electrical module, such as the 80E08 and 80E10 TDR Modules, manufactured and sold by Tektronix, Inc., additional propagation delays for the TDR channels in the modules are calculated and stored in memory 256.

When an electrical module 204 is inserted into a bay 202 of the sampling oscilloscope 200 and coupled to the electrical interface, an interrupt signal is provided to the sampling oscilloscope controller 222 via the interrupt line 220. The sampling oscilloscope controller 222 initiates a data request to the electrical module 204 via the communications bus 214. In return, the electrical module controller 254 reads the electrical module parameters including the propagation time delay parameters from the memory 256 and passes the parameters back to the sampling oscilloscope controller 222 via the communications bus 214. The sampling oscilloscope controller 222 subtracts the strobe delay value from the channel path insertion delay value and applies the resultant value to the horizontal position for each acquired sample of the input signal to the electrical module 204. For example, before correction, a positive value of channel path insertion delay, and a negative value of strobe delay causes horizontal waveform position values of the acquired samples to become more negative, relative to the delay at the sampling oscilloscope electrical interface, by the value of the channel path insertion delay—strobe delay. Or, for a given horizontal position on the display 208, the addition of an electrical module with a positive channel path insertion delay—strobe delay, causes the waveform on the display 208 to shift to the right by the value of the channel path insertion delay—strobe delay. Correction of the horizontal waveform position values on the display 208 for the electrical module 204 in this situation involves subtracting the value of the channel path insertion delay—strobe delay from the horizontal position that would otherwise be assigned to the acquired samples without the electrical module 204.

When another electrical module 204 is inserted into a bay 202 of the sampling oscilloscope 200 and coupled to the electrical interface, another interrupt signal is provided to the sampling oscilloscope controller 222 via the interrupt line 220. The sampling oscilloscope controller 222 initiates a data request to new electrical module 204 via the communications bus 214. In return, the new electrical module controller 254 reads the electrical module parameters including the propagation time delay parameters from the memory 256 and passes the parameters back to the sampling oscilloscope controller 222 via the communications bus 214. The sampling oscilloscope controller 222 subtracts the strobe delay value from the channel path insertion delay value and applies the resultant value to the horizontal position for each acquired sample of the input signal to the new electrical module 204. As with the first electrical module 204, the horizontal waveform position values on the display 208 for the electrical module 204 are corrected by subtracting the value of the channel path insertion delay—strobe delay from the horizontal position that would otherwise be assigned to the acquired samples without the electrical module 204. The resulting waveforms for electrical module are repositioned so that the waveforms are substantially overlapping on the display 208.

While the above sampling oscilloscope 200 is described using single channel electrical modules 204, the invention may be implemented using dual channel electrical modules, such as the 80E09 Sampling Module, manufactured and sold by Tektronix, Inc. The dual channel sampling module has two separate sampling channels with each channel having a sampler 250 and amplifier circuitry 252. Each sampler receives separate strobe signals. During calibration, the channel path insertion delay and the strobe delay is calculated for each sampling channel and stored in the memory 256. Further, if TDR circuitry is included in the electrical module, such as in the 80E08 and 80E10 Dual Channel Time Domain Reflectometry Sampling Modules, manufactured sold by Tektronix, Inc., propagation delay parameters are calculated for each of the TDR channels are stored in the memory 256. The stored time delay parameters are read out from the memory of the electrical modules when they are connected to the sampling oscilloscope 200 and used to correct for the time delays inherent in the circuitry of the electrical modules.

It will be obvious to those having skill in the art that many changes may be made to the details of the above-described embodiments of this invention without departing from the underlying principles thereof. The scope of the present invention should, therefore, be determined only by the following claims.

What is claimed is:

1. A time shifting signal acquisition probe system comprising
   a signal acquisition probe having a memory therein containing a time delay value representative of the propagation time delay of an electrical signal passing through the signal acquisition probe;
   a measurement test instrument receiving the electrical signal from the signal acquisition probe generating digital samples of the electrical signal in an acquisition system and producing a waveform record in response to a trigger signal; and
   a communications bus coupled between the signal acquisition probe and the measurement test instrument for coupling the signal acquisition probe time delay value from the signal acquisition probe to the measurement test instrument wherein processing circuitry in the measurement test instrument time shifts the waveform record of the electrical signal relative to the trigger signal by the amount of the signal acquisition probe time delay value.

2. The time shifting signal acquisition probe system as recited in claim 1 wherein the waveform record has a starting pointer index that is time shifted relative to the trigger signal by the amount of the signal acquisition probe time delay value.

3. The time shifting signal acquisition probe system as recited in claim 2 processing circuitry further comprises display circuitry receiving the waveform record and displaying a portion of the waveform record on a display device.

4. The time shifting signal acquisition probe system as recited in claim 3 wherein the portion of the waveform record being displayed has a starting display pointer index into the waveform record and an ending display pointer into the waveform record.

5. The time shifting signal acquisition probe system as recited in claim 4 wherein the displayed portion of the waveform record includes the digital samples of the waveform record from the starting display pointer index to the ending display pointer index.

6. The time shifting signal acquisition probe system as recited in claim 1 further comprising a second signal acquisition probe having a memory therein containing a second signal acquisition probe time delay value representative of the propagation time delay of a second electrical signal through the second signal acquisition probe with the second signal acquisition probe coupling the second electrical signal to the measurement test instrument that generates digital samples of the second electrical signal in a second acquisition system and produces a second waveform record in response to the trigger signal, and a second communications bus coupled between the second signal acquisition probe and the measurement test instrument for coupling the second signal acquisition probe time delay value to the measurement test instrument wherein the processing circuitry time shifts the second waveform record of the second electrical signal relative to the trigger signal by the amount of the second signal acquisition probe time delay value.

7. The time shifting signal acquisition probe system as recited in claim 6 wherein the waveform records of the electrical signal and the second electrical signal are substantially time aligned relative to the trigger signal.

8. The time shifting signal acquisition probe system as recited in claim 7 wherein the waveform records of the electrical signal and the second electrical signal each have a starting pointer index that is time shifted relative to the trigger signal by the amount of the respective signal acquisition probe time delay values of the respective signal acquisition probe and the second signal acquisition probe.

9. The time shifting signal acquisition probe system as recited in claim 8 processing circuitry further comprises display circuitry receiving the waveform records of the electrical signal and the second electrical signal and displaying a portion of each of the waveform records on a display device.

10. The time shifting signal acquisition probe system as recited in claim 9 wherein the portions of the waveform records being displayed each has a starting display pointer index into the its respective waveform record and an ending display pointer into its waveform record.

11. The time shifting signal acquisition probe system as recited in claim 10 wherein the displayed portions of each of the waveform records includes the digital samples of the waveform record from the starting display pointer index to the ending display pointer index.

12. A time shifting signal acquisition probe system comprising
a signal acquisition probe having a memory therein containing a time delay value representative of the propagation time delay of an electrical signal passing through the signal acquisition probe;
a measurement test instrument receiving the electrical signal from the signal acquisition probe generating digital samples of the electrical signal in an acquisition system and producing a waveform record in response to a trigger signal; and
a communications bus coupling the signal acquisition probe time delay value to the measurement test instrument wherein processing circuitry in the measurement test instrument time shifts a portion of the waveform record relative to the trigger signal by the amount of the signal acquisition probe time delay value.

13. The time shifting signal acquisition probe system as recited in claim 12 processing circuitry further comprises display circuitry receiving and displaying the time shifted portion of the waveform record on a display device.

14. The time shifting signal acquisition probe system as recited in claim 13 wherein the portion of the waveform record being displayed has starting and ending display pointer indexes into the waveform record that are time shifted relative to the trigger signal by the amount of the signal acquisition probe time delay value.

15. The time shifting signal acquisition probe system as recited in claim 12 further comprising a second signal acquisition probe having a memory therein containing a second signal acquisition probe time delay value representative of the propagation time delay of a second electrical signal through the second signal acquisition probe with the second signal acquisition probe coupling the second electrical signal to the measurement test instrument that generates digital samples of the second electrical signal in a second acquisition system and produces a second waveform record in response to the trigger signal, and a second communications bus coupled between the second signal acquisition probe and the measurement test instrument for coupling the second signal acquisition probe time delay value to the measurement test instrument wherein the processing circuitry time shifts a portion of the second waveform record of the second electrical signal relative to the trigger signal by the amount of the second signal acquisition probe time value.

16. The time shifting signal acquisition probe system as recited in claim 15 wherein the portions of the waveform records of the electrical signal and the second electrical signal are substantially time aligned relative to the trigger signal.

17. The time shifting signal acquisition probe system as recited in claim 16 wherein the portions of the waveform records of the electrical signal and the second electrical signal each have starting and ending pointer indexes that are time shifted relative to the trigger signal by the amount of the signal acquisition probe time delay values of the respective signal acquisition probe and the second signal acquisition probe.

18. The time shifting signal acquisition probe system as recited in claim 17 processing circuitry further comprises display circuitry receiving the portions of the waveform records of the electrical signal and the second electrical signal and displaying the portions of each of the waveform records on a display device.

19. The time shifting signal acquisition probe system as recited in claim 18 wherein the displayed portions of each of the waveform records includes the digital samples of the waveform record from the starting display pointer index to the ending display pointer index.

20. A time shifting signal acquisition module system comprising
a signal acquisition module having a memory therein containing time delay values representative of the propagation time delays of electrical signals in the signal acquisition module with one of the electrical signal being received from a device under test and repetitively sampled in response to a strobe signal to generate electrical samples of the electrical signal;
a measurement test instrument receiving the electrical samples of the electrical signal and generating digital samples of the electrical samples to produce a waveform record; and
a communications bus coupled between the signal acquisition module and the measurement test instrument for coupling the signal acquisition module time delay values from the signal acquisition module to the measurement test instrument wherein processing circuitry in the measurement test instrument time shifts the electrical samples of the waveform record by an amount of the signal acquisition module time delay values.

21. The time shifting signal acquisition module system as recited in claim 20 wherein the signal acquisition module receives the electrical signal from the device under test and the strobe signal from the measurement test instrument with the memory containing time delay values representing the propagation delay in the signal path of the signal under test and a propagation delay in the signal path of the strobe signal.

22. The time shifting signal acquisition module system as recited in claim 20 wherein the measurement test instrument subtracts the time delay value representing the propagation delay in the signal path of the strobe signal from the time delay value representing the propagation delay in the signal path of the signal under test and applies the result to the electrical samples of the waveform record.

* * * * *